United States Patent
Ching et al.

(10) Patent No.: US 9,716,096 B1
(45) Date of Patent: Jul. 25, 2017

(54) SEMICONDUCTOR STRUCTURE WITH FEATURE SPACER AND METHOD FOR MANUFACTURING THE SAME

(71) Applicant: TAIWAN SEMICONDUCTOR MANUFACTURING CO., LTD., Hsinchu (TW)

(72) Inventors: Kuo-Cheng Ching, Hsinchu County (TW); Chun-Hsiung Lin, Hsinchu County (TW); Chih-Hao Wang, Hsinchu County (TW); Ying-Keung Leung, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/194,711

(22) Filed: Jun. 28, 2016

(51) Int. Cl.
| | |
|---|---|
| *H01L 27/088* | (2006.01) |
| *H01L 27/11* | (2006.01) |
| *H01L 21/8234* | (2006.01) |
| *H01L 29/06* | (2006.01) |
| *H01L 29/66* | (2006.01) |
| *H01L 21/3115* | (2006.01) |
| *H01L 21/02* | (2006.01) |

(52) U.S. Cl.
CPC .... *H01L 27/1104* (2013.01); *H01L 21/02126* (2013.01); *H01L 21/31155* (2013.01); *H01L 21/823431* (2013.01); *H01L 27/1116* (2013.01); *H01L 29/0653* (2013.01); *H01L 29/66795* (2013.01)

(58) Field of Classification Search
CPC .......... H01L 27/1104; H01L 21/02126; H01L 21/31155; H01L 21/823431; H01L 27/1116; H01L 29/0653; H01L 29/66795
USPC ........................................................ 257/394
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2014/0191324 A1* | 7/2014 | Cai ........................ | H01L 29/785 257/368 |
| 2014/0282326 A1 | 9/2014 | Chen et al. | |
| 2016/0111448 A1* | 4/2016 | Hsu ..................... | H01L 27/1211 257/506 |

* cited by examiner

*Primary Examiner* — Trung Q Dang
*Assistant Examiner* — Patricia Reddington
(74) *Attorney, Agent, or Firm* — McClure, Qualey & Rodack, LLP

(57) ABSTRACT

A semiconductor structure includes a first fin structure, a gate structure, a first spacer, and a second space spacer. The gate structure traverses the first fin structure. The first fin structure has an exposed portion exposed out of the gate structure. The first spacer is positioned at and in contact with a side of the exposed portion of the first fin structure. The second space spacer is positioned at and in contact with another side of the exposed portion of the first fin structure. The first spacer has a top surface over than a top surface of the second spacer.

20 Claims, 18 Drawing Sheets

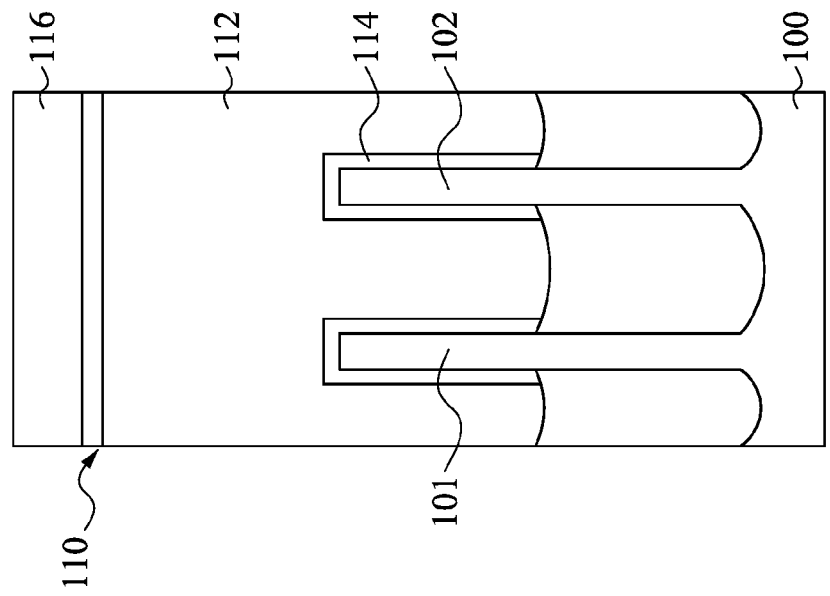
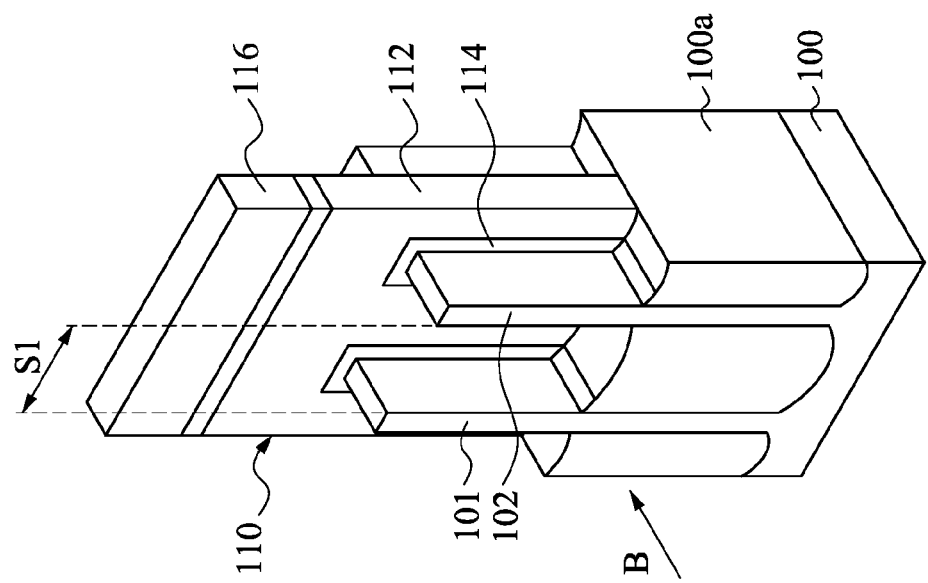

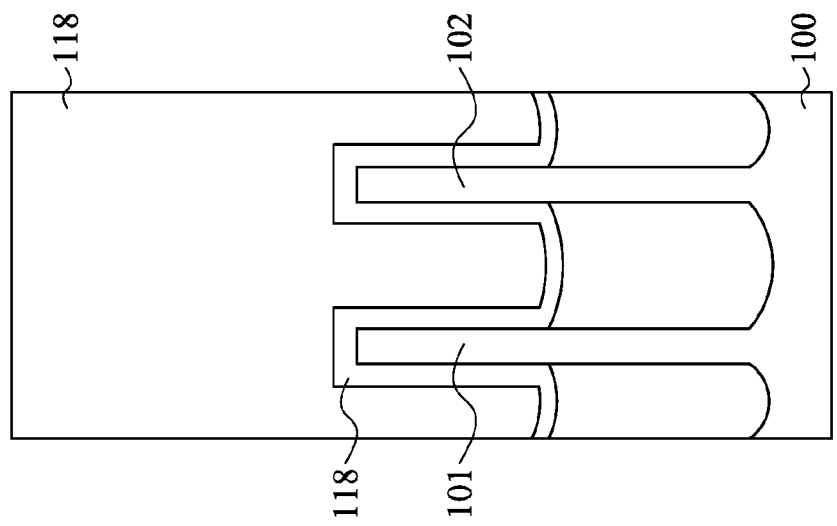
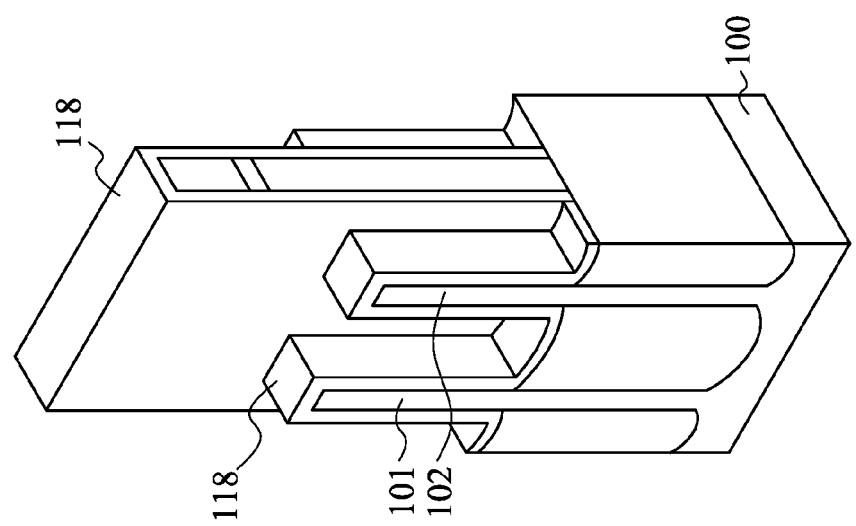
Fig. 3A
Fig. 3B

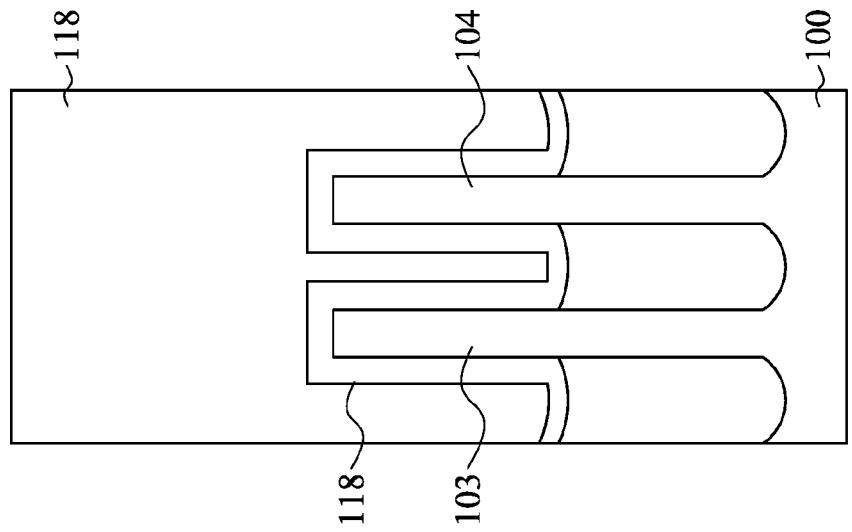
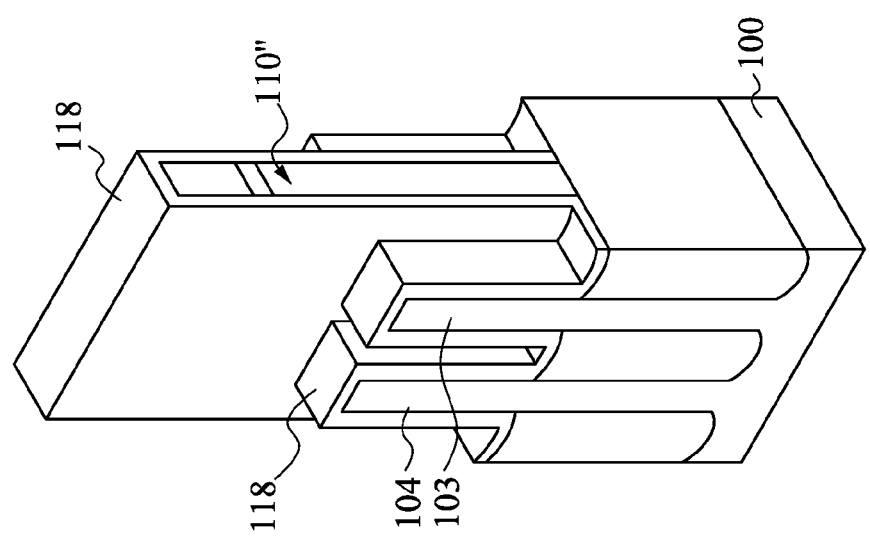
Fig. 3C
Fig. 3D

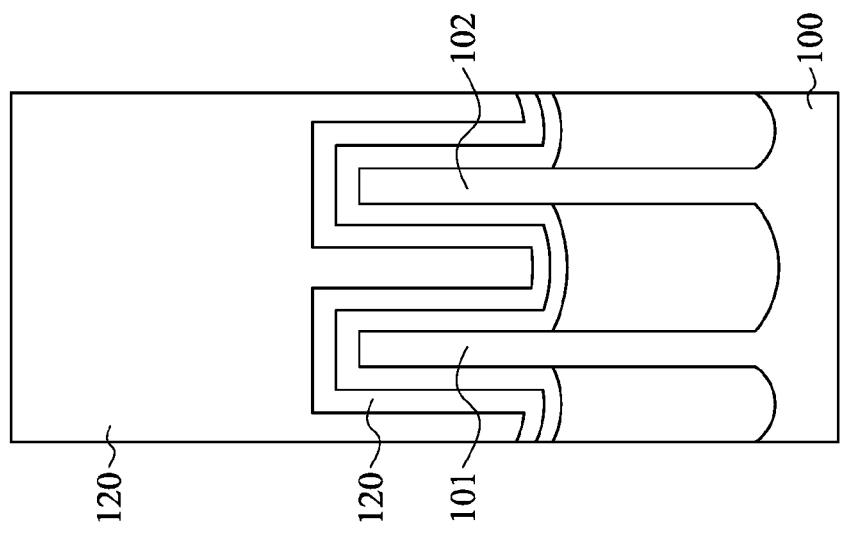
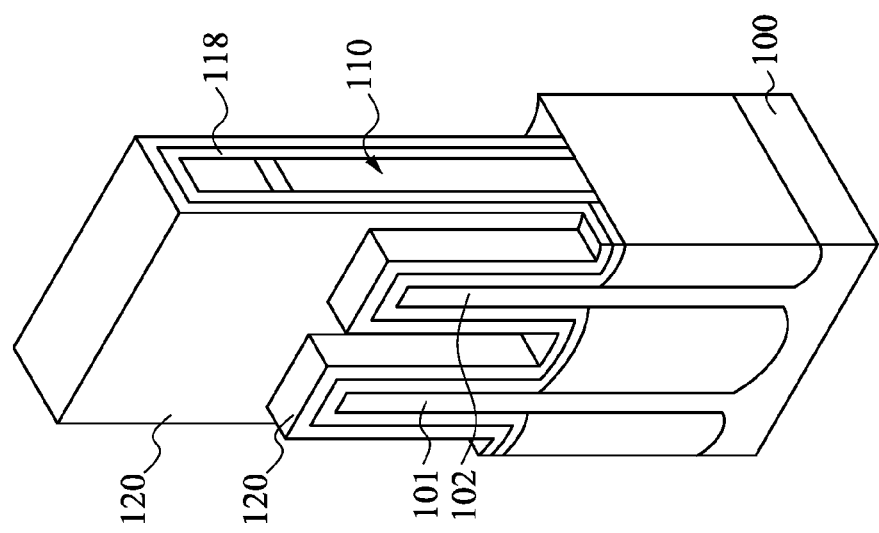
Fig. 4B
Fig. 4A

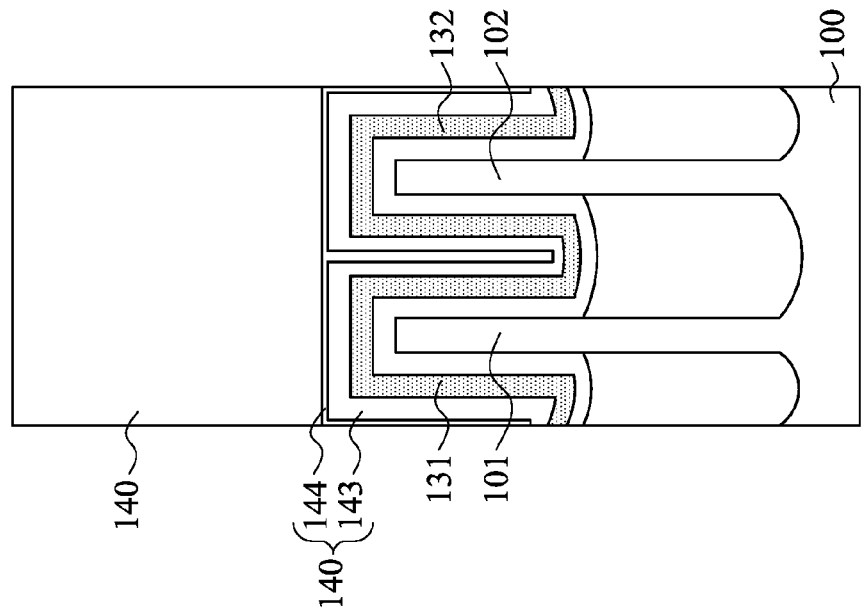
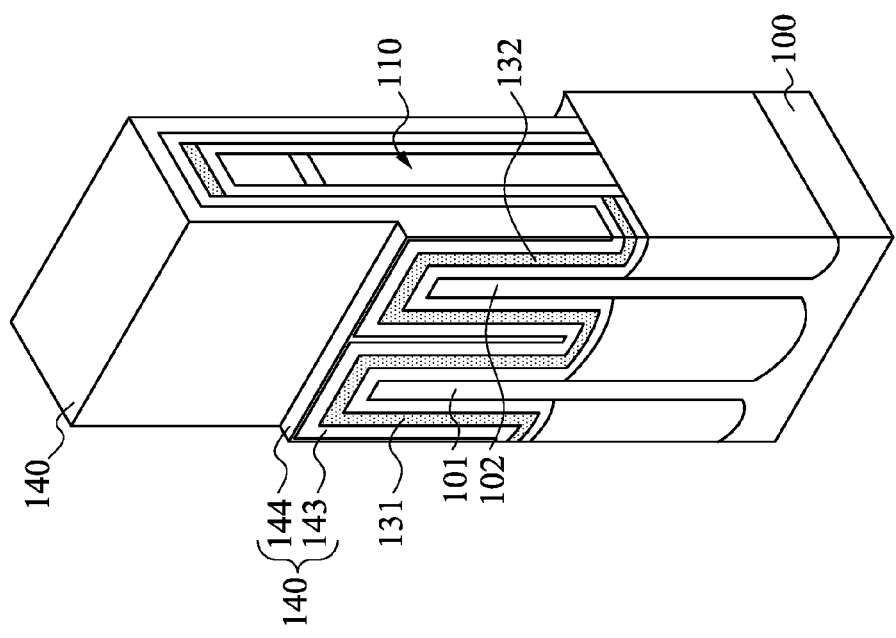

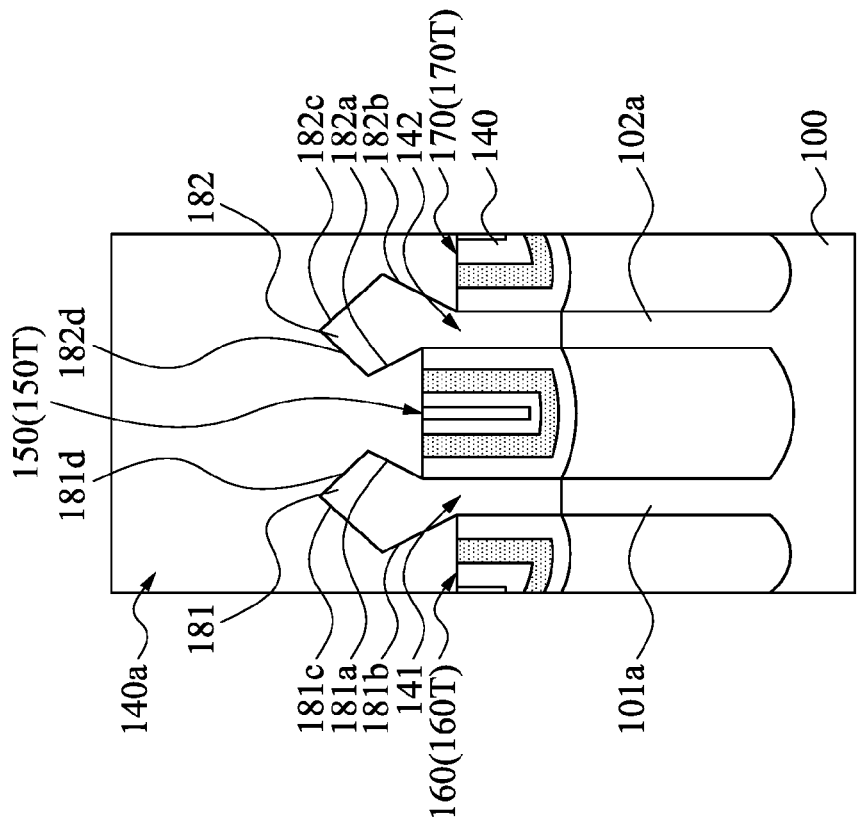
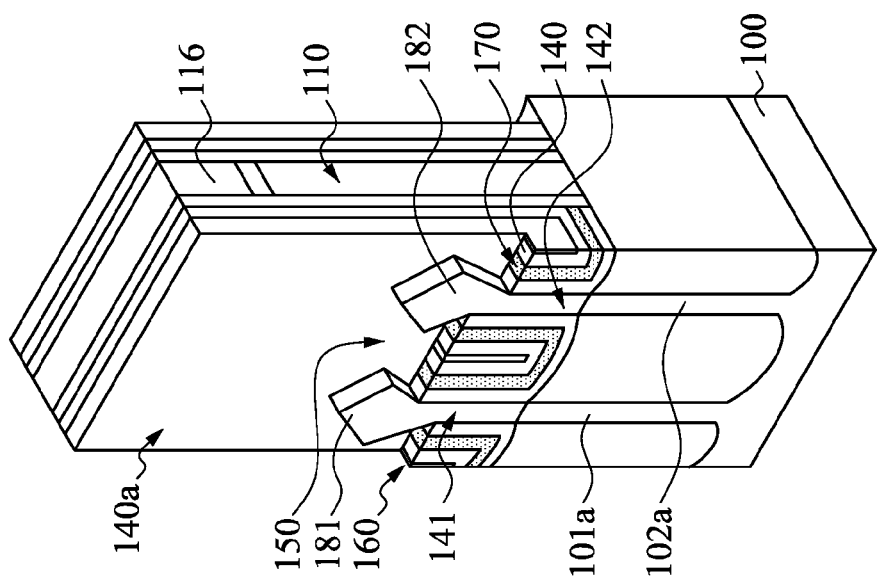
Fig. 8B
Fig. 8A

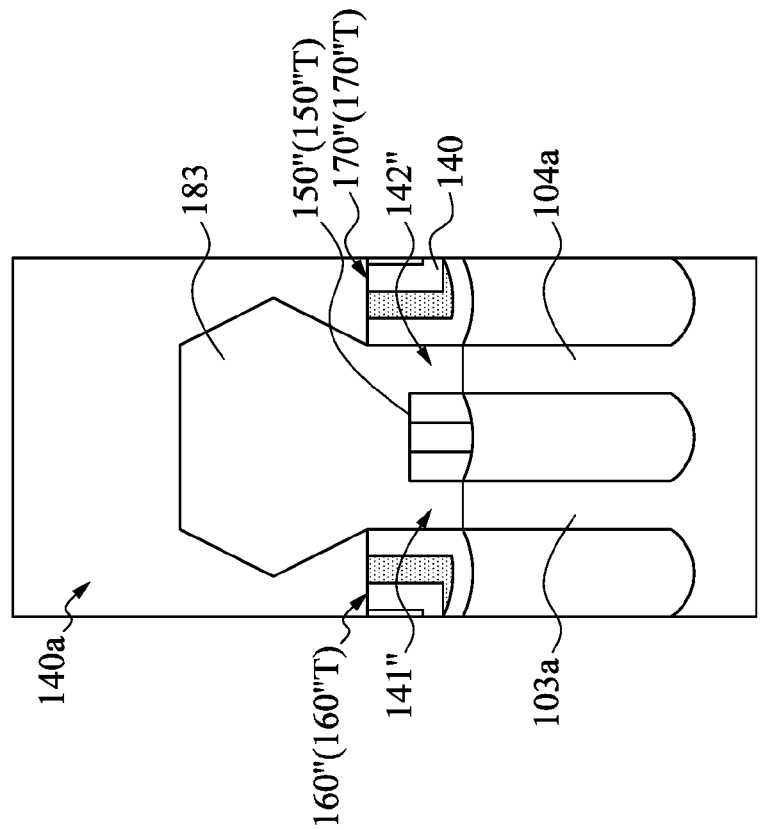
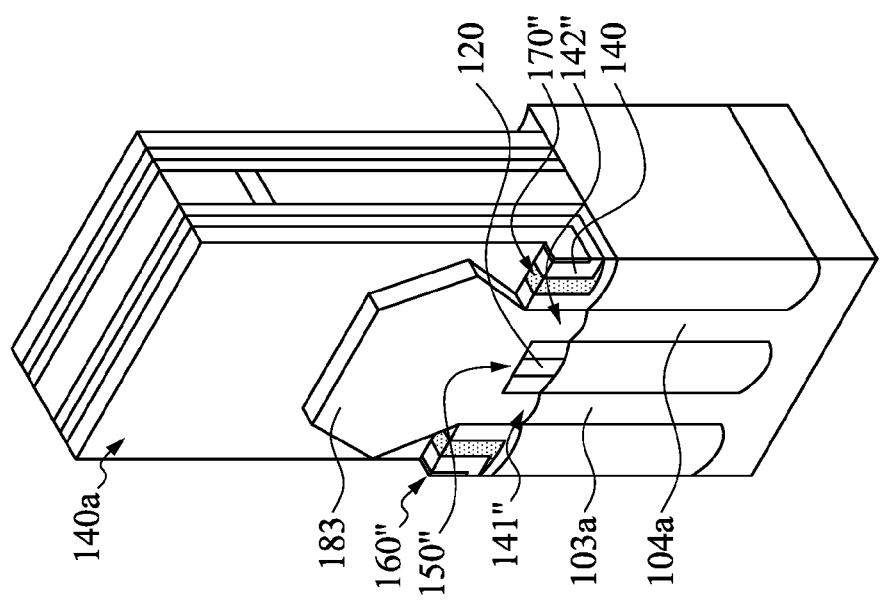
Fig. 8D
Fig. 8C

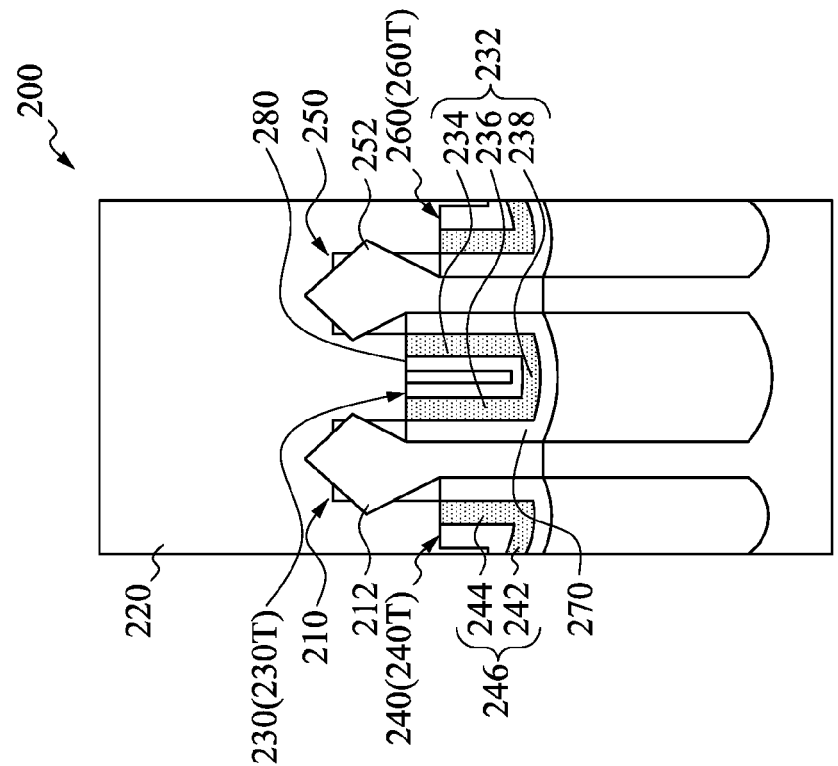
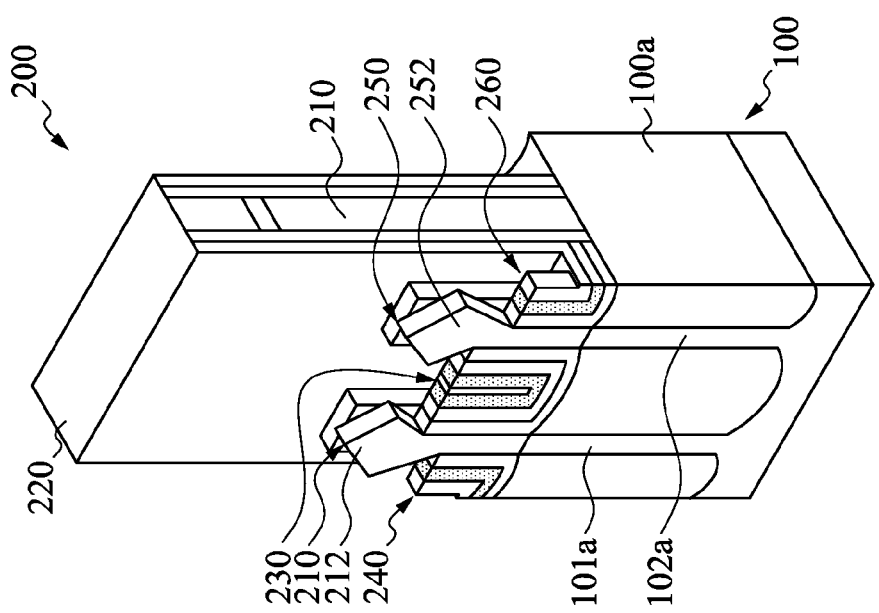
Fig. 9B
Fig. 9A

SEMICONDUCTOR STRUCTURE WITH FEATURE SPACER AND METHOD FOR MANUFACTURING THE SAME

BACKGROUND

The semiconductor integrated circuit (IC) industry has experienced rapid growth. Technological progress in IC manufacture has produced several generations of ICs, and each generation fabricates smaller and more complex circuits than the previous generation. Currently, the semiconductor industry has progressed into nanometer technology nodes for higher device density and better electrical performance, and a variety of challenges from fabrication and design have led semiconductor technologies to three dimensional designs, such as fin-like field effect transistors (finFETs). A typical finFET is fabricated with a thin "fin" extending on a substrate. The channel of the finFET is formed in the fin. In addition, a gate is formed to traverse the fin, and therefore a tri-gate structure is fabricated. It is beneficial to have a gate on three sides of the channel that allows the gate to control the channel from several sides. The finFET devices further include strained source/drain features to enhance carrier mobility and improve device performance. However, as device scaling down continues, conventional techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-9D are perspective views and lateral views schematically illustrating a method of forming a semiconductor structure in various process stages according to various embodiment of the present disclosure.

DETAILED DESCRIPTION

Figure 1:
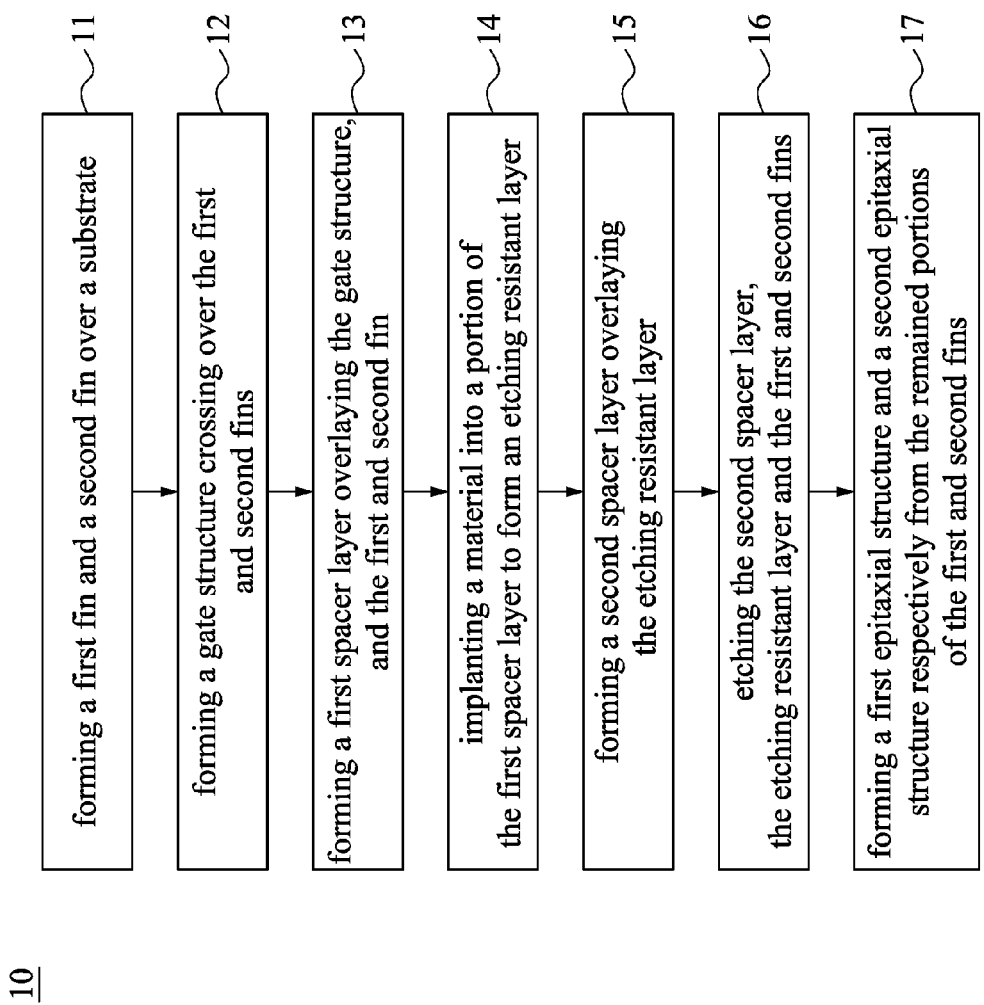
FIG. 1 is a flow chart illustrating a method 10 of forming a semiconductor structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The semiconductor industry has continually improved the speed and power of integrated circuits (ICs) by reducing the size of components within the ICs. Several advanced techniques have been developed to implement technique nodes with smaller feature sizes, and these techniques are employed in the manufacturing of the storage devices, for example. However, while the feature size is smaller than a certain dimension such as for example about 10 nm (i.e., technique node 10) or less, some processes suffer from bridge (i.e., shortage), or misalignment problems that degrade device performance and decrease the manufacture yield. Accordingly, one of the aspects of the present disclosure is to provide a solution to the bridge problem.

The present disclosure relates generally to a semiconductor structure and a method of manufacturing the semiconductor structure. The semiconductor structure disclosed herein may be applied in various semiconductor devices such as for example static random access memory (SRAM) devices, or the like, or other devices equipped with fin field effect transistors (finFETs). According to some embodiments of the present disclosure, the semiconductor device or the storage device has at least two finFETs adjacent to each other, and a feature spacer is formed between the source/drain regions of the two finFETs to avoid the bridge issue. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a flow chart illustrating a method 10 of forming a semiconductor structure according to various embodiments of the present disclosure. The method 10 includes operation 11, operation 12, operation 13, operation 14, operation 15, operation 16, and operation 17. FIGS. 2A-9D collectively illustrate more detailed manufacturing methods as a series of perspective views and lateral views in accordance with various embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated operations and/or acts can be further divided into sub-operations and/or sub-acts in some implementations, while in other implementations some of the illustrated operations and/or acts can be carried out concurrently with one another.

FIGS. 2A, 3A, 3A, 4A, 5A, 6A, 7A, 8A, and 9A are perspective views illustrating a method of forming the semiconductor structure in various process stages on a certain region of a substrate, such as a SRAM cell region. FIGS. 2B, 3B, 3B, 4B, 5B, 6B, 7B, 8B, and 9B are lateral views when viewed from the direction B of the corresponding figures with label "A". FIGS. 2C, 3C, 3C, 4C, 5C, 6C, 7C, 8C, and 9C are perspective views illustrating a method of forming the semiconductor structure on another region of the substrate, such as a logic region. FIGS. 2D, 3D, 3D, 4D, 5D, 6D, 7D, 8D, and 9D are lateral views when viewed from the direction D of the corresponding figures with label "C".

Referring to FIGS. 1 and 2A-2B, the method 10 proceeds to the operation 11 by forming a first fin 101 and a second fin 102 over a substrate 100. According to various embodiments, the substrate 100 includes semiconductor material. In some embodiments, the substrate 100 may be a silicon-on-insulator (SOI) substrate. The SOI substrate may be fabricated using any suitable methods. In some embodiments, the substrate 100 may be a bulk silicon substrate. In yet some embodiments, the substrate 100 include an elementary semiconductor such as for example germanium or silicon in a crystalline structure. In yet some embodiments, the substrate 100 include a compound semiconductor such as for example gallium arsenic, silicon carbide, indium phosphide, gallium phosphide or indium antimonide, or combinations thereof. In yet some embodiments, the substrate may include an alloy semiconductor such as silicon germanium, silicon germanium carbide, gallium arsenic phosphide, and gallium indium phosphide. In yet some embodiments, the substrate may include an epitaxial layer. For example, the substrate may have an epitaxial layer overlying a bulk semiconductor.

In some embodiments, the first fin 101 and the second fin 102 may be a portion of the substrate 100, and disposed between an isolation feature 100a. The isolation feature 100a includes a dielectric material, such as silicon oxide, silicon nitride, a low dielectric constant (low k) material, or a combination thereof. In order to form the first fin 101, the second fin 102, and the isolation feature 100a, the substrate 100 may be etched to form a plurality of trenches by lithography and etch processes. The trenches may define the region of the isolation feature 100a. Illustrative examples of the trench etching technique include a high-density plasma etch that utilizes either inductive, helicon, or electron cyclotron resonance (ECR) plasmas, or other suitable etch techniques. The trenches are then filled by a dielectric material. Illustrative trench filling techniques include chemical vapor deposition (CVD), high density plasma (HDP) CVD, sub-atmospheric pressure CVD (SACVD), and spin-on dielectric (SOD). Thereafter, the excess dielectric material may be removed using any suitable process so to form first fin 101, the second fin 102, and the isolation feature 100a.

In some embodiments of the present disclosure, the first and second fins 101, 102 include crystalline silicon. In some embodiments, the top surfaces of the first and second fins 101, 102 has a lattice plane with Miller index (100), and the sidewalls of the first and second fins 101, 102 has a lattice plane with Miller index (110). In yet some embodiments, the first fin 101 and the second fin 102 may be formed by epitaxy processes, and the isolation feature 100a may be a shallow trench isolation (STI). In yet some embodiments, each of the first and second fins 101, 102 may include a lower part containing silicon (Si) and an upper part containing silicon germanium (SiGe). In various examples, the first fin 101 is discrete from the second fin 102 by a distance S1. The distance S1 may be for example approximately 5-20 nm. Further, each of the first and second fins 101, 102 has a width ranged from about 5 nm to about 25 nm, for example.

Figure 2D:
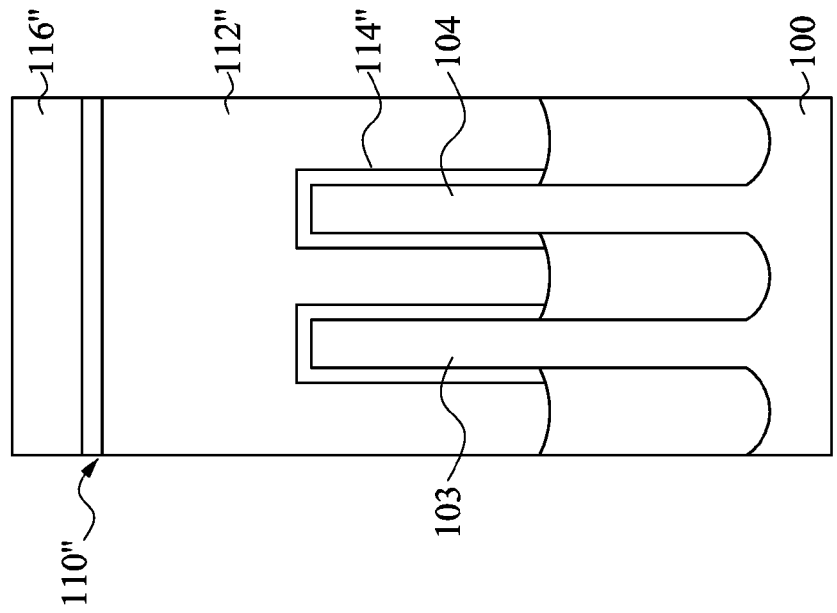
Figure 2C:
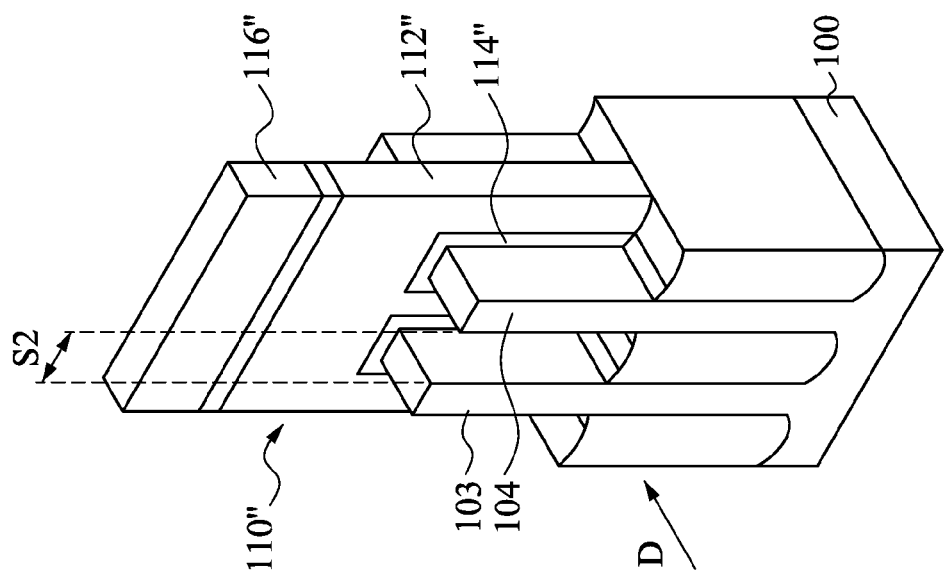

According to some embodiments of the present disclosure, referring to FIGS. 2C and 2D, the operation 11 may optionally includes concurrently forming a third fin 103 and a fourth fin 104 over the substrate 100 when forming the first and second fins 101,102. It is noted that the third and fourth fins 103, 104 are positioned in a different region from the first and second fins 101,102. In examples, the third and fourth fins 103, 104 are fabricated in the logic region of a SRAM device, whereas the first and second fins 101,102 are fabricated in the SRAM cell region. Similarly, the third fin 103 is separated from the fourth fin 104 by a distance S2, but distance S2 is smaller than the distance S1 between the first and second fins 101,102.

Referring to FIG. 1, the method 10 proceeds to the operation 12 by forming a gate structure 110 crossing over the first and second fins 101, 102, as shown in FIGS. 2A and 2B. In some embodiments, the gate structure 110 may be formed over portions of the first and second fins 101, 102, and the gate structure 110 traverses the first and second fins 101, 102. In some embodiments, the gate structure 110 may include a gate electrode 112, a gate dielectric 114, and a hard mask 116. The gate structure 110 may be formed by any suitable process or processes. For example, the gate structure 110 can be formed by a procedure including one or more deposition processes, one or more photolithography patterning processes, and one or more etching processes. Examples of the deposition processes include physical vapor deposition (PVD), chemical vapor deposition (CVD), atomic layer deposition (ALD), other suitable techniques, and/or combinations thereof. The photolithography patterning processes include photoresist coating, soft baking, mask aligning, exposure, post-exposure baking, developing the photoresist, rinsing, hard baking, other suitable processes, and/or combinations thereof. The etching processes include dry etching such as reactive ion etching, wet etching, and/or other etching methods. The gate electrode 112 may include any suitable material such as for example polysilicon, copper, titanium, aluminum, tantalum, tungsten, molybdenum, nickel silicide, cobalt silicide, or other suitable materials. The gate dielectric 114 may be made of dielectric material such as for example silicon oxide, silicon nitride, high-k dielectric material, and/or other suitable dielectric material. Illustrative examples of high-k dielectric material include, but are limited to, HfZrO, HfSiON, HfTaO, HfSiO, HfTiO, HfO2, zirconium oxide, aluminum oxide, or the like. The hard mask 116 may include any suitable material, for example, silicon nitride, silicon oxynitride and silicon carbide.

According to some embodiments of the present disclosure, referring to FIGS. 2C and 2D, the operation 11 may optionally includes concurrently forming another gate structure 110" crossing over the third and fourth fins 103, 104 during the formation of the gate structure 110. The gate structure 110" may has a structure similar to the gate structure 110. For example, the gate structure 110" may include a gate electrode 112", a gate dielectric 114", and a hard mask 116".

Referring to FIGS. 3A-3B, the method 10 after the operation 12 may optionally include an operation of conformally forming a sealing layer 118 covering the gate structure 110, and the first and second fins 101, 102. In some embodiments, the sealing layer 118 is deposited in a blanket manner. Additionally, referring to FIGS. 3C-3D, in the embodiments where the gate structure 110", the third and fourth fins 103, 104 are formed in the logic region, the sealing layer 118 further covers the gate structure 110" and the third and fourth fins 103, 104. The sealing layer 118, for example, may include a low-k material or the like. Illustrative examples of the low-k material include phosphosilicate glass (PSG), borophosphosilicate glass (BPSG), fluorinated silicate glass (FSG), silicon carbon material, or the like.

Referring to FIGS. 1 and 4A-4B, the method 10 proceeds to the operation 13 by forming a first spacer layer 120 overlaying the gate structure 110, and the first and second fins 101, 102. In various embodiments, the first spacer layer 120 is conformally deposited covering the gate structure 110, and the first and second fins 101, 102. It is noted that the first spacer layer 120 does not completely fill the space between the first and second fins 101, 102. That is, a spacing interval is still present between the portions of the first spacer layer 120 covering the first and second fins 101, 102. The first spacer layer 120, for example, may include silicon nitride or the like.

Figure 4C:
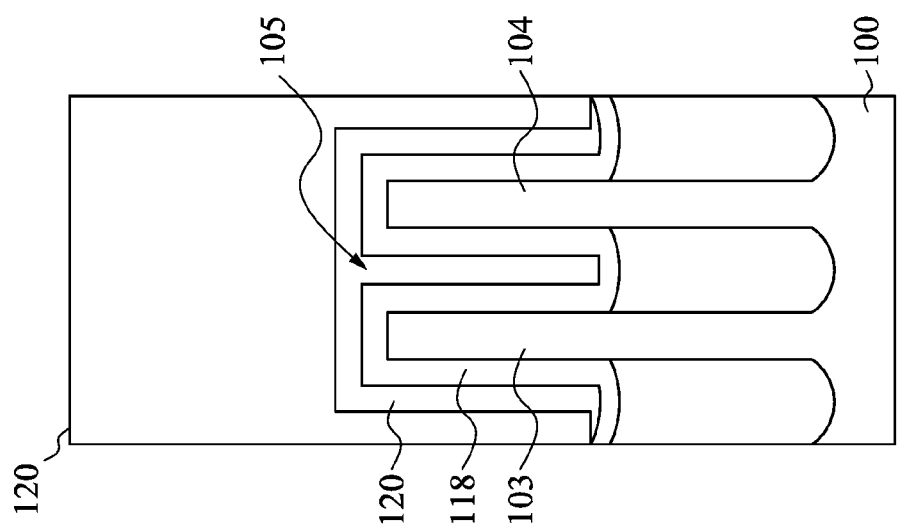
Figure 4D:
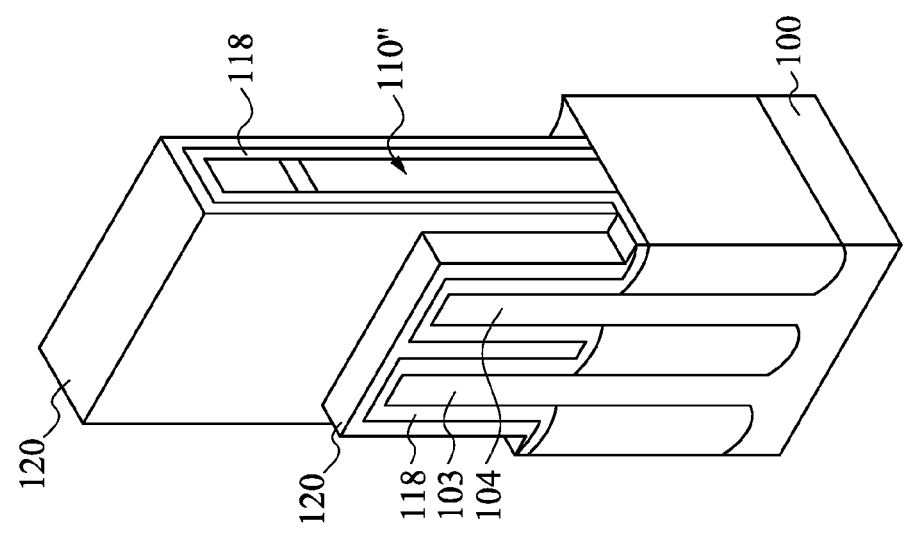

In some embodiments, the first spacer layer 120 is deposited in a blanket manner. Referring to FIGS. 4C-4D, in the embodiments where the gate structure 110", the third and fourth fins 103, 104 are formed in the logic region, the first spacer layer 120 further covers the gate structure 110" and the third and fourth fins 103, 104. Moreover, the first spacer layer 120 completely fills the space in between the third and fourth fins 103, 104, and this structure of the first spacer layer 120 between the third and fourth fins 103, 104 is different from that between the first and second fins 101, 102. In some examples, the distance between the third and fourth fins 103, 104 is less than the distance between the first and second fins 101, 102 so that the first spacer layer 120 completely fills the space in between the third and fourth fins 103, 104.

Figure 5B:
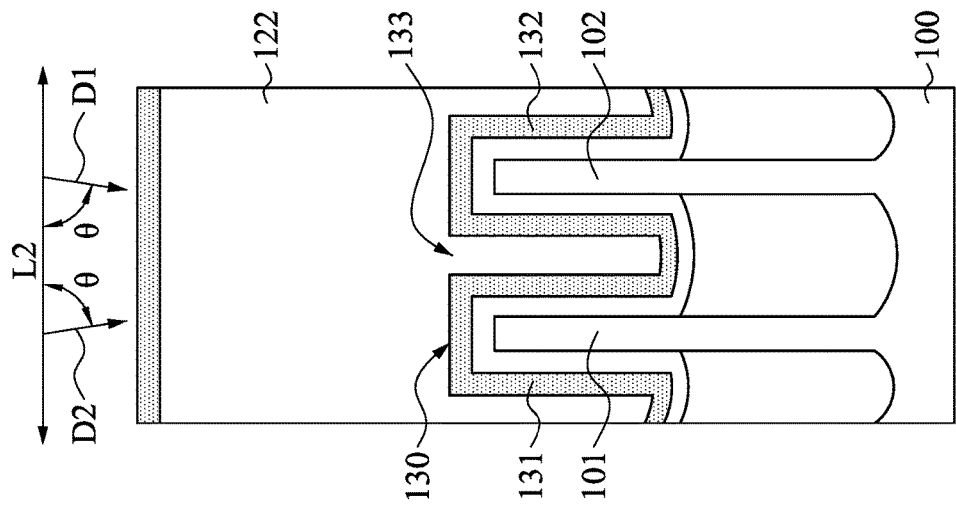
Figure 5A:
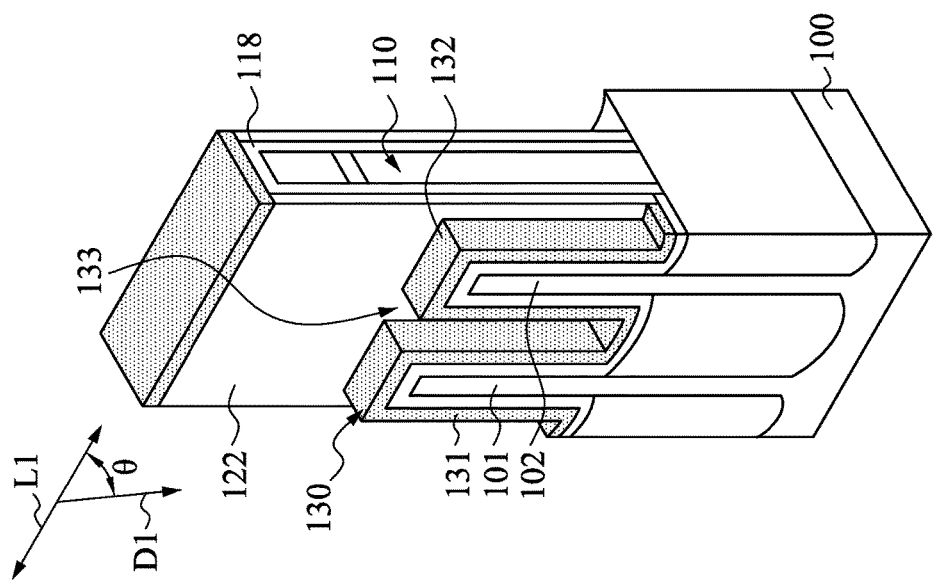

Referring to FIGS. 1 and 5A-5B, the method 10 proceeds to the operation 14 by implanting a material into a portion of the first spacer layer 120 to form an etching resistant layer 130. In specifics, the implantation process makes the implanted portion of the first spacer layer 120 being converted into the etching resistant layer 130, which exhibits a relatively stronger etching resistant. In some embodiments, the operation 14 includes implanting the material in a direction D1 along a lengthwise axis direction L1 of the gate structure 110, with a depression angle θ. For example, the depression angle θ may be ranged from 70 degrees to 85 degrees, for example about 74 degrees, about 76 degrees, about 78 degrees, about 80 degrees or about 82 degrees. In other words, the implanting direction D1 forms an included angle of about 5 degrees to about 20 degrees with a perpendicular direction of the process surface of the substrate 100, specifically about 10 degrees to about 14 degrees. As shown in FIGS. 5A-5B, the etching resistant layer 130 at least includes a first portion 131 and a second portion 132 respectively wrapping the first and second fins 101, 102. Furthermore, a spacing 133 still exists between the first and second portions 131, 132 of the etching resistant layer 130. Because the implanting direction D1 is along the lengthwise axis direction L1 with a depression angle θ, another portion 122 of the first spacer layer 120, which is located on the lengthwise sidewall of the gate structure 110, is not implanted and substantially free from the implanting material. In yet some embodiments, the implantation process further includes implanting the material in a direction D2 along the lengthwise axis direction L1, with a depression angle θ ranged from 70 degrees to 85 degrees. Accordingly, the inner sidewalls and the bottom of the spacing 133 are desirably implanted, and therefore the etching resistant layer 130 is formed in the spacing 133 between the first and the second fins 101,102. In some examples, the implanting material includes carbon, oxygen, or a combination thereof, and the etching resistant layer 130 may include SiON, SiCON or a combination thereof. In some examples, the etching resistant layer 130 has a carbon or oxygen atomic percentage ranged from about 10% to about 50%, for example 15%, 20%, 25%, 30%, 35%, 40%, and 45%. In yet some examples, the implantation process uses a dose of 0.2-5.0 E15 cm$^{-2}$ and energy of 0.2-2.0 KeV.

Figure 5D:
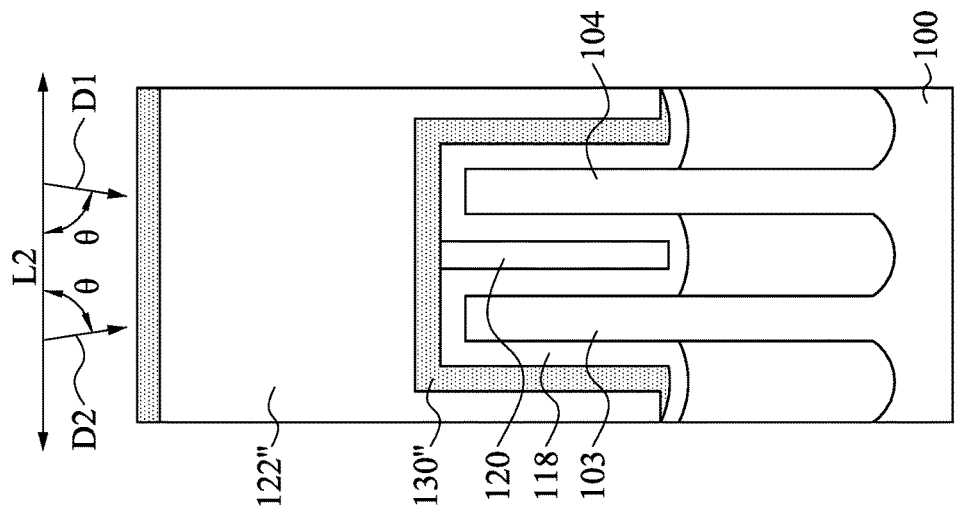
Figure 5C:
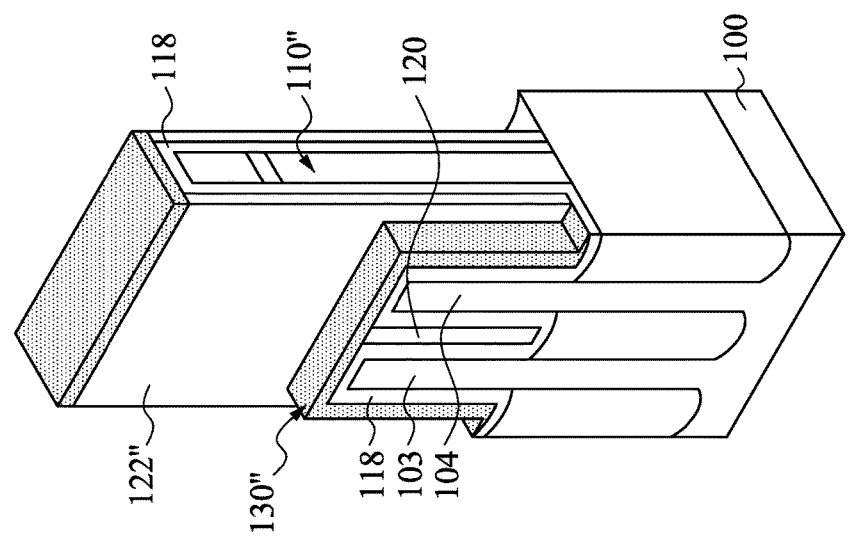

According to some embodiments of the present disclosure, referring to FIGS. 5C and 5D, the operation 14 may includes concurrently implanting the material into portions of the first spacer layer 120 located in the logic region. In particular, the portions of the first spacer layer 120 covering the third and fourth fins 103, 104 are implanted so to form an etching resistant layer 130". In some examples, the direction of the lengthwise axis direction L2 of the gate structure 110" is substantially identical to the direction of the lengthwise axis direction L1 of the gate structure 110. Therefore, the portion 122" of the first spacer layer 120, which is located on the lengthwise sidewall of the gate structure 110", is not implanted and substantially free from the implanting material. It is noted that there is no etching resistant layer 130" in the space between the third and fourth fins 103, 104 because the space there between has been completely filled by the first spacer layer 120.

Figure 6A:
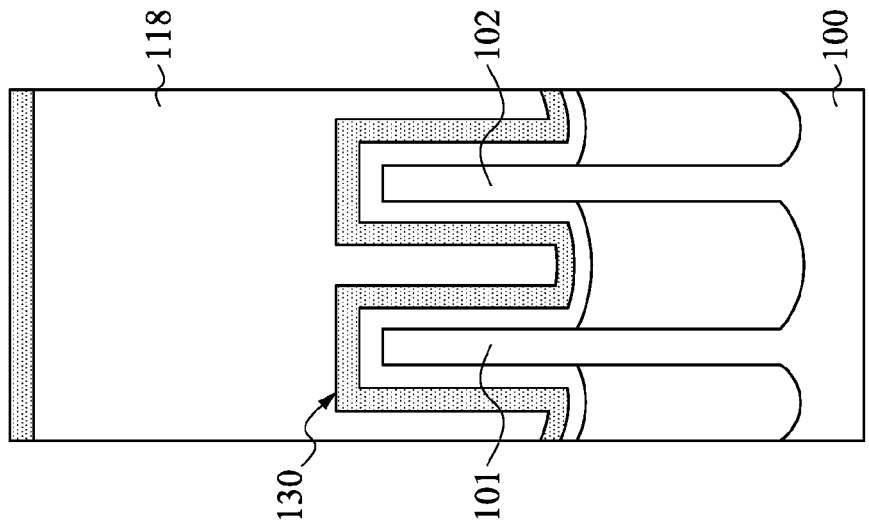
Figure 6B:
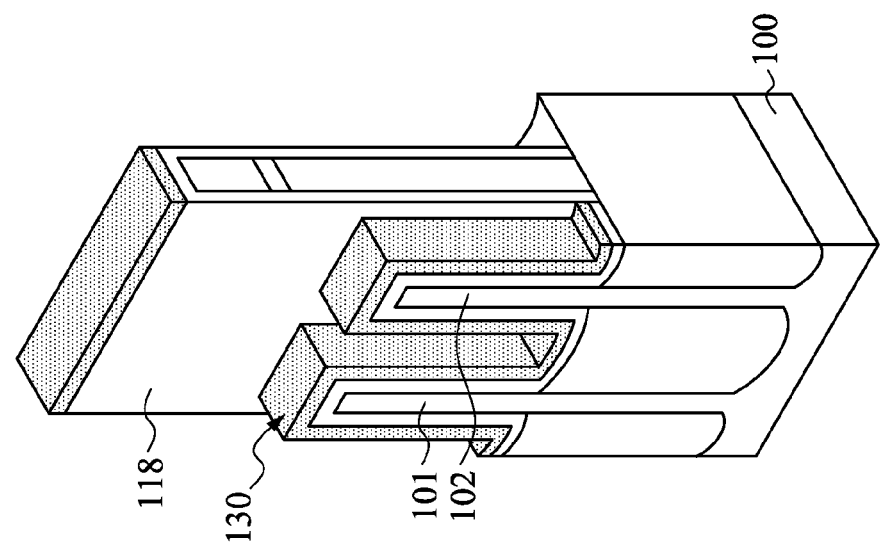
Figure 6D:
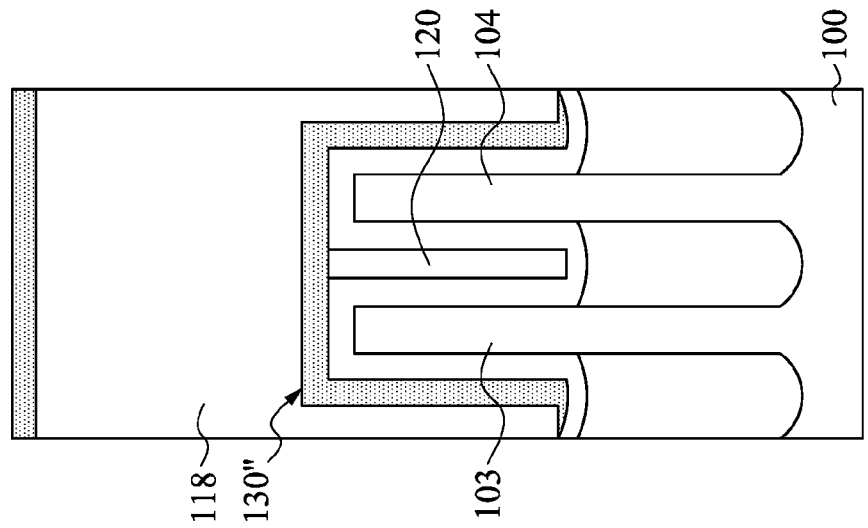
Figure 6C:
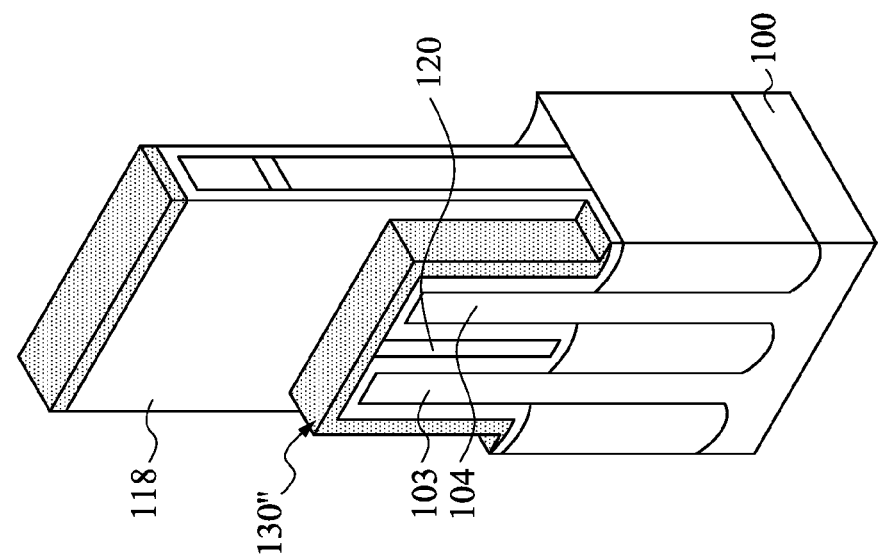

Referring to FIGS. 6A and 6B, the method 10 may optionally include an operation of removing the non-implanted portion 122 of the first spacer layer 120 after the operation 14. In particular, as the implanted portion of the first spacer layer 120 (i.e., the etching resistant layer 130) has an etching resistance greater than the non-implanted portion of the first spacer layer 120, the non-implanted portion such as the portion 122 may be etched away, leaving the etching resistant layer 130 on the substrate. In some examples, phosphoric acid ($H_3PO_4$) may be used as etchant to remove the non-implanted portion of the first spacer layer with a selectivity ratio of approximately 10 or more. Also, as shown in FIGS. 6C-6D, the non-implanted portion such as the portion 122" may be etched away, leaving the etching resistant layer 130" on the substrate.

Referring to FIGS. 1 and 7A-7B, the method 10 proceeds to the operation 15 by forming a second spacer layer 140 overlaying the etching resistant layer 130. The second spacer layer 140 further fills the spacing 133 between the first and second portions 131, 132 of the etching resistant layer 130 depicted in FIGS. 5A-5B. The second spacer layer 140 may be formed by depositing one or more dielectric layers in a blanket manner, and covers the gate structure 110 and the layers or features formed on the gate structure 110. In some embodiments, the formation of the second spacer layer 140 includes sequentially depositing a low-k layer 143 and a silicon nitride layer 144, as shown in FIGS. 7A-7B.

Figure 7D:
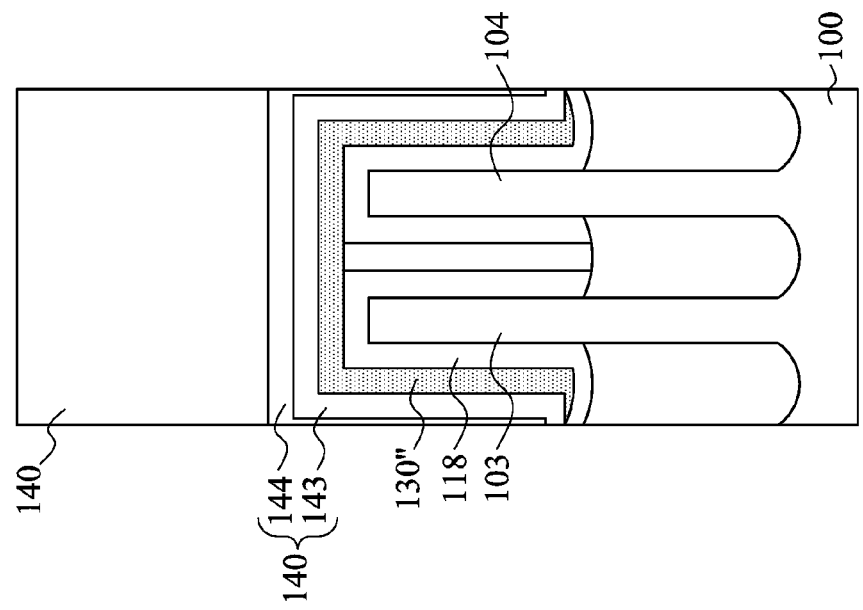
Figure 7C:
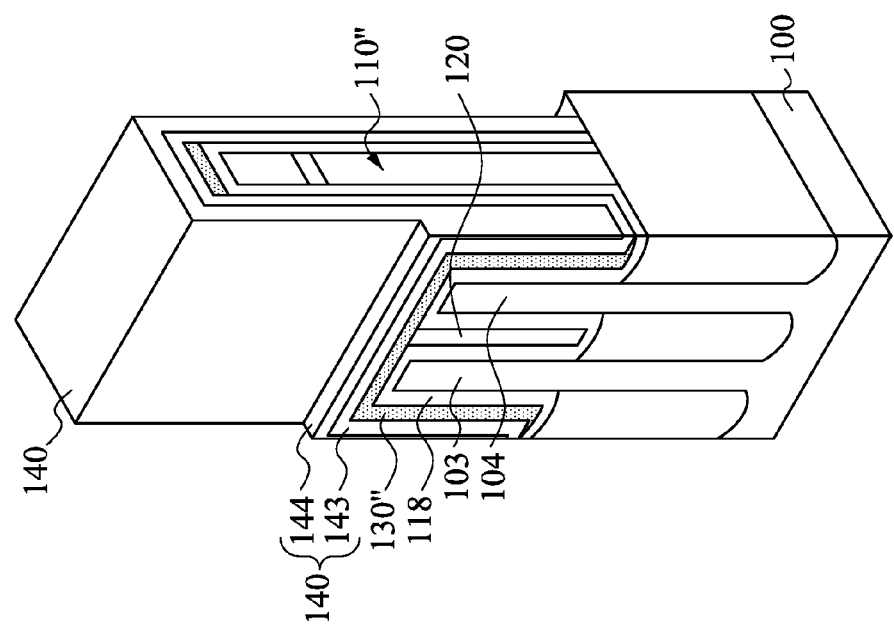

Referring to FIGS. 7C-7D, in the embodiments where the logic region has the gate structure 110", the third and fourth fins 103, and the etching resistant layer 130", the second spacer layer 140 further covers over the gate structure 110", the third and fourth fins 103, 104 and the etching resistant layer 130".

Referring to FIGS. 1 and 8A-8B, the method 10 proceeds to the operation 16 by etching the second spacer layer 140, the etching resistant layer 130, and the first and second fins 101, 102. The remained portions of the second spacer layer 140 and the etching resistant layer 130 form a first spacer 150, a second spacer 160, and a third spacer 170. Furthermore, the etching of the first and second fins 101, 102 form a first recess 141 and a second recess 142, from which certain features are fabricated in the subsequent operation. The first recess 141 is between the first and second spacers 150, 160, whereas the second recess 142 is between the first and third spacers 150, 170. In specifics, the operation 16 includes applying an etchant having a considerably faster etching rate to the fins 101, 102, as compared to the second spacer layer 140 and the etching resistant layer 130. Accordingly, the first and second recesses 141, 142 are formed between the first, second, and third spacers 150, 160, 170. Further, the first and second fins 101, 102 respectively have remained portions 101a, 102a, that constitute the bottoms of the first and second recesses 141, 142.

It is noted that the top surface 150T of the first spacer 150 is higher than or over the top surfaces 160T, 170T of the second and third spacers 160, 170. Referring back to FIG. 7A and FIG. 5A, the spacing 133 in FIG. 5A is filled with the portions of the etching resistant layer 130 and the second spacer layer 140 between the first and second fins 101, 102, so that the etching rate in this region is relatively slower, resulting in the top surface 150T of the first spacer 150 being higher than the top surfaces 160T, 170T of the second and third spacers 160, 170. In some examples, the structures formed on the hard mask 116 of the gate structure 110 are also removed in the operation 16, but a vertical portion 140a of the second spacer layer 140 remains on sidewalls of the gate structure 110.

Referring to FIGS. 8C-8D, in the embodiments where the logic region has the structure shown in FIGS. 7C-7D, the operation 16 includes etching the second spacer layer 140, the etching resistant layer 130", the first spacer layer 120, and the third and fourth fins 103, 104, so that the remained portions thereof form a fourth spacer 150", a fifth spacer 160", and a sixth spacer 170", and a third recess 141" as well as a fourth recess 142". The third recess 141" is between the fourth and fifth spacers 150", 160", whereas the fourth recess 142" is between the fourth and sixth spacers 150", 170". The remained portions 103a, 104a of the third and fourth fins 103, 104 constitute the bottoms of the third and fourth recesses 141", 142". In specifics, the operation 16 includes applying an etchant having a considerably faster etching rate to the fins 103, 104, as compared to the second spacer layer 140 and the etching resistant layer 130". Accordingly, the third recess 141" and the fourth recess 142" are formed between the fourth, fifth, and sixth spacers 150", 160", 170". It is further noted that the features of the fourth spacer 150" differ from that of the first spacer 150 in FIGS. 8A-8B. Particularly, the top surface 150"T of the fourth spacer 150" is lower than the top surfaces 160"T, 170"T of the fifth and sixth spacers 160", 170". In specifics, as illustrated in FIGS. 7C-7D, there is no etching resistant layer 130" between the third and fourth fins 103, 104, and therefore this portion, i.e., between the third and fourth fins 103, 104, has a relatively faster etching rate. Accordingly, the fourth spacer 150" suffers a relatively faster etching rate, and therefore the top surface 150"T thereof is lower than the top surfaces 160"T, 170"T of the fifth and sixth spacers 160".

In yet some embodiments, the operation 16 includes a first etching process and a second etching process that differs from the first etching process. Specifically, the first etching process is carried out for etching the structure shown in FIGS. 7A-7B (e.g., the SRAM cell region) while the structure shown in FIGS. 7C-7D (e.g., the logic region) is protected from etching. In addition, the second etching process is carried out for etching the structure shown in FIGS. 7C-7D while the structure shown in FIGS. 7A-7B is protected from etching.

Referring back to FIGS. 1 and 8A-8B, the method 10 proceeds to the operation 17 by forming a first epitaxy structure 181 and a second epitaxy structure 182 respectively from the remained portions 101a, 102a of the first and second fins 101, 102. In various embodiments, the first and second epitaxy structures 181, 182 are epitaxially grown from the surfaces of the remained portions 101a, 102a of first and second fins 101, 102 in the first and second recesses 141, 142.

In some embodiments, the first and second epitaxy structures 181, 182 are asymmetric in structure due to the differences in height between the first spacer 150 and each of the second spacer 160 and the third spacer 170. In specifics, the first epitaxy structure 181 has four facets 181a, 181b, 181c, and 181d. The growth of the facet 181a is restrained during the epitaxy process because it adjoins the first spacer 150 with a high height. To the contrary, the facet 181b has a relatively better growth because the second spacer 160 has a relatively lower height. Therefore, the first epitaxy structure 181 has a tendency to grow towards the second spacer 160 and far away the second epitaxy structure 182. Similarly, the second epitaxy structure 182 has facets 182a, 182b, 182c, 182d. The growth of the facet 182a is restrained during the epitaxy process, whereas the facet 182b has a relatively better growth. The first second structure 182 has a tendency to grow towards the third spacer 170 and far away the first epitaxy structure 181. Accordingly, the bridge of the epitaxy structures 181, 182 may be resolved or improved.

In some embodiments, the epitaxy process may use molecular beam epitaxy, vapor-phase epitaxy (VPE), ultra-high vacuum CVD (UHV-CVD)) or other suitable techniques. The epitaxy process may use precursors which interact with the composition of the remained portions 101a, 102a of the first and second fins 101, 102. In some examples, the precursors interact with silicon of the remained fins 101a, 102a. In yet some examples, the precursors interact with silicon germanium (SiGe) of the remained fins 101a, 102a.

Referring to FIGS. 8C-8D, the operation 16 may optionally include concurrently forming epitaxy structure 183 from the remained portions 103a, 104a of the third and fourth fins 103, 104. The growing epitaxy structures from third recess 141" and fourth recess 142" are finally merged together because the fourth spacer 150" is lower than both of the fifth and sixth spacers 160", 170". Accordingly, it is possible to concurrently form the epitaxy structure 183 in the logic region shown FIGS. 8C-8D and the epitaxy structures 181, 182 in the SRAM cell region shown in FIGS. 8A-8B.

The method 10 may optionally include other operations or processes after the operation 17. For example, the remained vertical portion 140a of the second spacer layer 140 shown in FIGS. 8A-8D may be partially or completely removed, as illustrated in FIGS. 9A-9D.

Figure 9D:
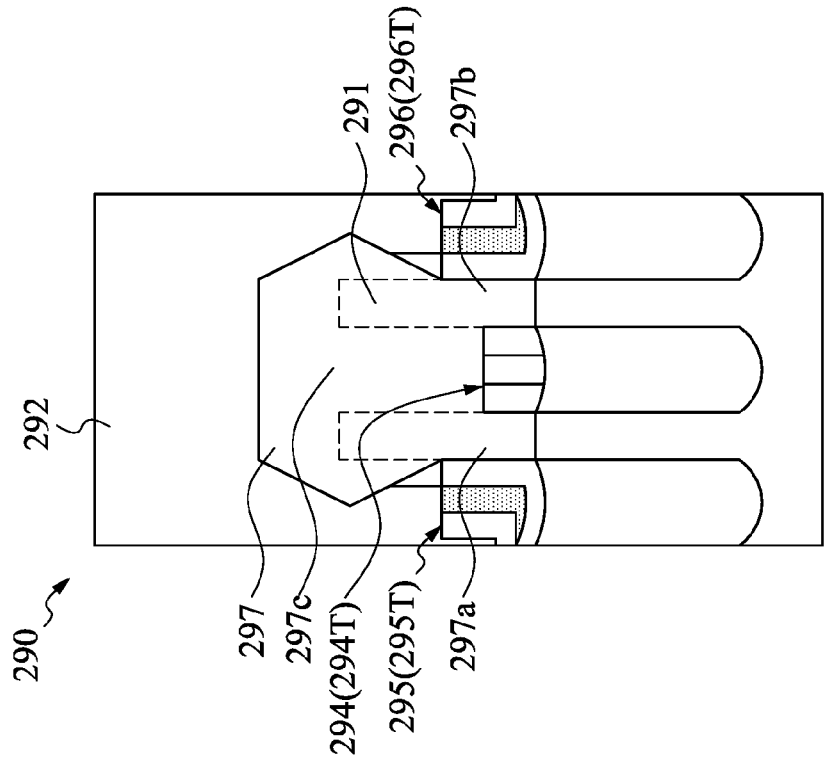

According to another aspect of the present disclosure, a semiconductor structure is provided. FIGS. 9A-9D schematically illustrate a semiconductor structure 200 according to various embodiments of the present disclosure. Referring to FIG. 9A-9B, the semiconductor structure 200 includes a first fin structure 210, a gate structure 220, a first spacer 230, and a second spacer 240. In some embodiments, the semiconductor structure 200 includes one or more pull-up transistors in the SRAM cell region of a SRAM device.

The first fin structure 210 is formed over a substrate 100. In some embodiments, the first fin structure 210 includes a portion 101a in an isolation feature 100a of the substrate 100 and a portion 212 extending upwards from the portion 101a.

The gate structure 220 traverses the first fin structure 210, and the portion 212 of the first fin structure 210 is exposed out of the gate structure 220.

The first spacer 230 is positioned at and in contact with a side of the exposed portion 212 of the first fin structure 210. In some embodiments, the first spacer 230 includes an etching resistant structure 232 (labeled in FIG. 9B), which includes a first portion 234, a second portion 236, and a lateral portion 238. The first and the second portions 234, 236 extend upwards from opposite sides of the lateral portion 238 to a top surface 230T of the first spacer 230. In some examples, the etching resistant structure 232 includes carbon, oxygen, or a combination thereof in a molar concentration of 10-50%, for example 15%, 20%, 25%, 30%, 35%, 40%, and 45%. In yet some examples, the etching resistant structure 232 may include SiON, SiCON or a combination thereof.

Optionally, the semiconductor structure 200 may includes a second fin structure 250 spaced apart from the first fin structure 210. The gate structure 220 traverses the second fin structure 250, and the second fin structure 250 has an exposed portion 252 exposed out of the gate structure 220. The first spacer 230 extends from the exposed portion 212 of the first fin structure 210 to the exposed portion 252 of the second fin structure 250.

In yet some embodiments, the first spacer 230 further includes a first dielectric portion 270 (labeled in FIG. 9B) positioned between the etching resistant structure 232 and each of the exposed portions 212, 252 of the first and second fin structures 210, 250. In yet some embodiments, the first spacer 230 further includes a second dielectric portion 280 (labeled in FIG. 9B) positioned between the first and the second portions 234, 236 of the etching resistant structure 232.

The second spacer 240 is positioned at and in contact with another side of the exposed portion 212 of the first fin structure 210. The top surface 230T of the first spacer 230 is higher than or over the top surface 240T of the second spacer 240. In some embodiments, the second spacer 240 includes an etching resistant structure 246 having a based portion 242 and a standing portion 244. The standing portion 244 extends upwards from the based portion 242 to the top surface 240T of the second spacer 240. In examples, the material of the etching resistant structure 246 is the same as that of the etching resistant structure 232.

Optionally, the semiconductor structure 200 may includes a third spacer 260 in contact with the exposed portion 252 of the second fin structure 250. The third spacer 260 and the first spacer 230 are positioned at opposite sides of the exposed portion 252 of the second fin structure 250. In some examples, the surface 260T of the third spacer 260 is lower than the top surface 230T of the first spacer 230. In some yet examples, the surface 260T of the third spacer 260 is substantially leveled with the top surface 240T of the second spacer 240.

Figure 9C:
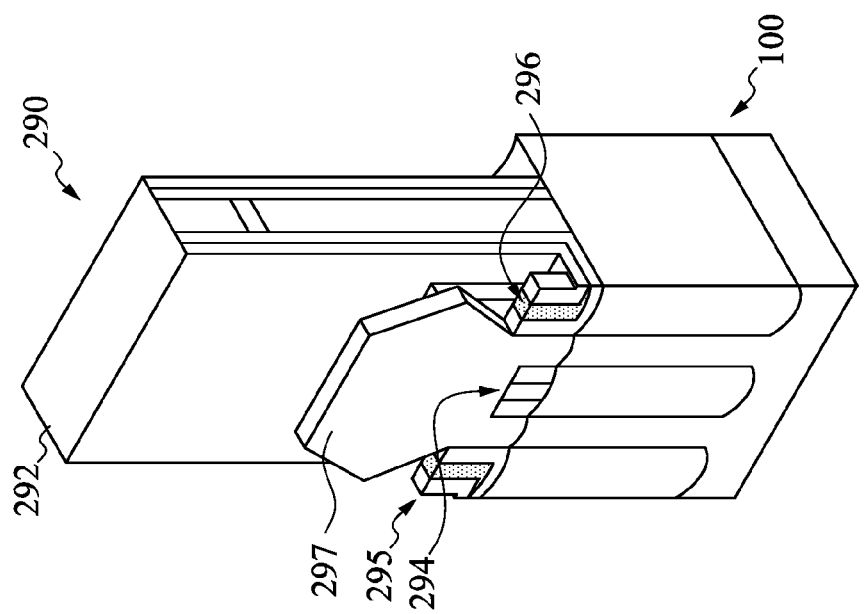

Referring to FIG. 9C-9D, the semiconductor structure 200 may optionally includes a logic transistor 290 in a logic region of the substrate 100. The logic transistor 290 includes at least a fin-liked channel structure 291, a gate structure 292, a fourth spacer 294, a fifth spacer 295, a sixth spacer 296, and an epitaxial structure 297. The fin-liked channel structure 291 may include silicon. The gate structure 292 crosses over the fin-liked channel structure 291. The fourth spacer 294, the fifth spacer 295, and the sixth spacer 296 are positioned at the same side of the gate structure 292. The fourth, the fifth, and the sixth spacers 294, 295, 296 are spaced apart from each other. The fourth spacer 294 is between the fifth spacer 295 and the sixth spacer 296. The fourth spacer 294 has a top surface 294T that is lower than the top surfaces 295T, 296T of the fifth and the sixth spacers 295, 296. The epitaxial structure 297 has a first foot 297a, a second foot 297b, and a merged portion 297c. The first and second foots 297a, 297b are respectively filled in a spacing between the fourth and fifth spacers 294, 295 and a spacing between the fifth and sixth spacers 295, 296. Further, the merged portion 297c extends upwards from the first and second foots 297a, 297b.

Figure 10B:
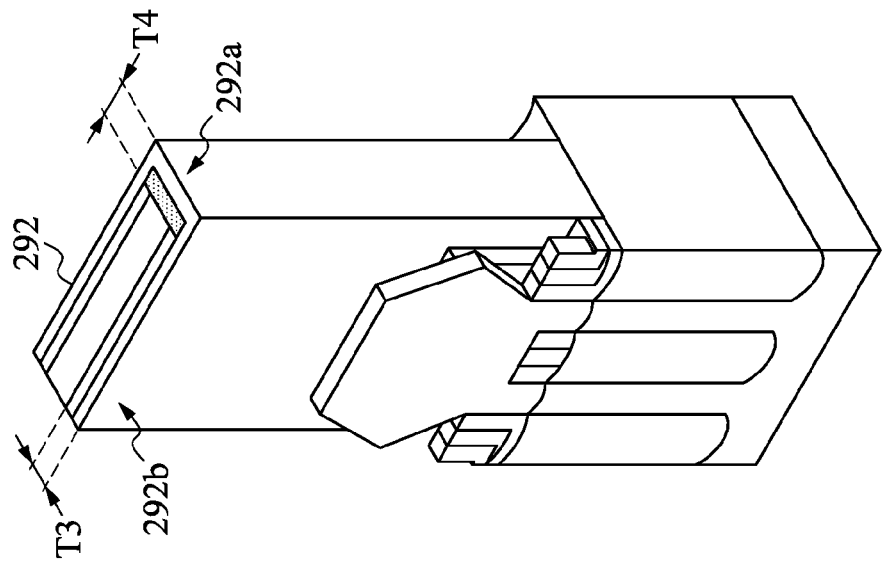
FIGS. 10A-10B are perspective views schematically illustrating terminal portions of the gate structures in a SRAM cell region and in a logic region, respectively.
Figure 10A:
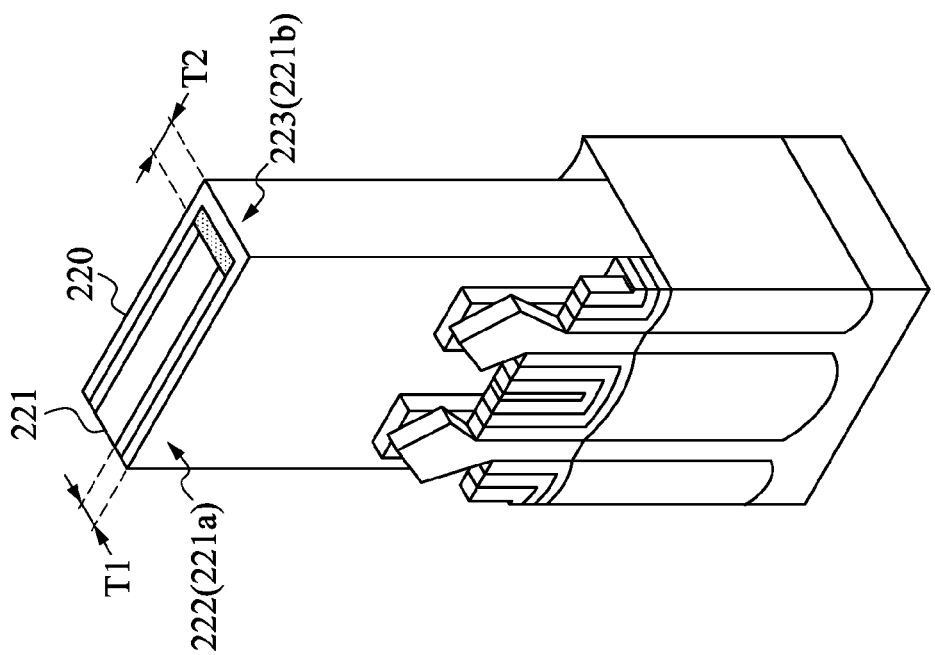

FIGS. 10A-10B are perspective views schematically illustrating the terminal portions of the gate structure 220 in the SRAM cell region and gate structure 292 in the logic region, respectively. As shown in FIG. 10A, the gate structure 220 includes a gate electrode 221, a lengthwise spacer 222, and a widthwise spacer 223. The gate electrode 221 has a lengthwise sidewall 221a and a widthwise sidewall 221b. The lengthwise spacer 222 covers the lengthwise sidewall 221a of the gate electrode 221. The widthwise spacer 223 covers the widthwise sidewall 221b of the gate electrode 221. The thickness T2 of the widthwise spacer 223 is greater than the thickness T1 of the lengthwise spacer 222. In specifics, referring back to FIGS. 5A-5B, the implantation process is performed along the lengthwise axis direction of the gate structure. The spacer layer 120 on the widthwise sidewall 221b of the terminal portion of the gate structure 220 is implanted as well. While the spacer layer 120 is implanted by the material such as for example carbon or oxygen, the thickness of the spacer layer 120 is increased, and the implanted portion of the spacer layer 120 is converted into the etching resistant layer. To the contrary, the spacer layer 120 on the lengthwise sidewall 221a is not implanted, so that the thickness of the spacer layer 120 on the lengthwise sidewall 221a is not increased. Therefore, the thickness T2 of the widthwise spacer 223 is greater than the thickness T1 of the lengthwise spacer 222 of the gate structure 220. In examples, the thickness T2 of the widthwise spacer 223 is about 2-15 nm thicker than the thickness T1 of the lengthwise spacer 222. Specifically, the thickness T2 is about 4-10 nm thicker than the thickness T1. In some embodiments, as shown in FIG. 10B, the thickness T4 of the widthwise spacer 292a of the gate structure 292 is greater than the thickness T3 of the lengthwise spacer 292b of the gate structure 292. In examples, the thickness T4 is about 2-15 nm thicker than the thickness T3. Specifically, the thickness T4 is about 4-10 nm thicker than the thickness T3.

Advantages of various embodiments of the present disclosure include providing a novel semiconductor structure and a novel method for manufacturing the semiconductor structure. The semiconductor structure and the method provided herein may resolve the bridge issue between two adjacent raised source/drain regions of adjacent finFETs when the critical dimension decreases to a certain value such as for example 10 nm.

In accordance with one aspect of some embodiments, a method includes the following operations: (i) forming a first fin and a second fin over a substrate, wherein the first fin is discrete from the second fin; (ii) forming a gate structure crossing over the first and second fins; (iii) forming a first spacer layer overlaying the gate structure, and the first and second fins; (iv) implanting a material into a portion of the first spacer layer to form an etching resistant layer having a first portion and a second portion respectively wrapping the first and second fins, wherein a spacing exists between the first and second portions; (v) forming a second spacer layer overlaying the etching resistant layer and filling the spacing; (vi) etching the second spacer layer, the etching resistant layer and the first and second fins to form a first spacer, a second spacer, a third spacer, a first recess between the first and second spacers, and a second recess between the first and third spacers, in which the first spacer has a top surface over than top surfaces of the second and third spacers, wherein remained portions of the first and second fins constitute bottoms of the first and second recesses; and (vii) forming a first epitaxial structure and a second epitaxial structure respectively from the remained portions of the first and second fins.

In accordance with another aspect of some embodiments, a semiconductor structure includes a first fin structure, a gate structure, a first spacer, and a second space spacer. The gate structure traverses the first fin structure. The first fin structure has an exposed portion exposed out of the gate structure. The first spacer is positioned at and in contact with a side of the exposed portion of the first fin structure. The second space spacer is positioned at and in contact with another side of the exposed portion of the first fin structure. The first spacer has a top surface over than a top surface of the second spacer.

In accordance with another aspect of some embodiments, a semiconductor device includes at least one SRAM cell. The SRAM cell includes a first fin structure, a second fin structure, a gate, a first spacer, a second space, and a third spacer. The second fin structure is spaced apart from the first fin structure. The gate traverses the first and the second fin structures. Each of the first and the second fin structures has an raised portion exposed out of the gate. The first spacer is positioned between and in contact with the raised portions of the first and the second fin structures. The second spacer is in contact with the raised portion of the first fin structure. The first and the second spacers are positioned at opposite sites of the raised portion of the first fin structure. The third spacer is in contact with the raised portion of the second fin structure. The first and the third spacers are positioned at opposite sites of the raised portion of the second fin structure. The first spacer has a top surface over than the top surfaces of the second and third spacers.

What is claimed is:

1. A method, comprising:
    forming a first fin and a second fin over a substrate, wherein the first fin is discrete from the second fin;
    forming a gate structure crossing over the first and second fins;
    forming a first spacer layer overlaying the gate structure, and the first and second fins;
    implanting a material into a portion of the first spacer layer to form an etching resistant layer having a first portion and a second portion respectively wrapping the first and second fins, wherein a spacing exists between the first and second portions;
    forming a second spacer layer overlaying the etching resistant layer and filling the spacing;
    etching the second spacer layer, the etching resistant layer and the first and second fins to form a first spacer, a second spacer, a third spacer, a first recess between the first and second spacers, and a second recess between the first and third spacers, wherein the first spacer has a top surface over than top surfaces of the second and third spacers, wherein remained portions of the first and second fins constitute bottoms of the first and second recesses; and
    forming a first epitaxial structure and a second epitaxial structure respectively from the remained portions of the first and second fins.

2. The method according to claim 1, wherein another portion of the first spacer layer which covers a sidewall of the gate structure is free from the implanting.

3. The method according to claim 1, further comprising: removing said another portion of the first spacer layer after implanting the material into the portion of the first spacer layer.

4. The method according to claim 1, comprising forming a sealing layer conformally covering the gate structure, and the first and second fins prior to forming the first spacer layer.

5. The method according to claim 1, wherein the etching resistant layer comprises SiON, SiCON or a combination thereof.

6. The method according to claim 1, wherein the material comprises carbon, oxygen, or a combination thereof.

7. The method according to claim 1, wherein implanting the material into the portion of the first spacer layer comprises implanting the material in a direction along a lengthwise axis direction of the gate structure with a depression angle of 70 degrees to 85 degrees.

8. The method according to claim 1, further comprising:
    concurrently forming a third fin and a fourth fin over the substrate during forming the first and second fins; and
    concurrently forming another gate structure crossing over the third and fourth fins during forming the gate structure crossing over the first and second fins;
    wherein after forming the first spacer layer, the first spacer layer covers said another gate structure, and the third and fourth fins, and completely fills a space in between the third and fourth fins.

9. The method according to claim 8, further comprising:
    concurrently implanting the material into a portion of the first spacer layer which covers the third and fourth fins so to form another etching resistant layer covering the third and fourth fins, wherein after forming the second spacer layer, the second spacer layer covers said another etching resistant layer;
    wherein etching the second spacer layer, the etching resistant layer and the first and second fins comprises etching said another etching resistant layer, and the third and fourth fins to form a fourth spacer, a fifth spacer, a sixth spacer, a third recess between the fourth and fifth spacers, and a fourth recess between the fourth and sixth spacers, wherein the fourth spacer has a top surface lower than top surfaces of the fifth and sixth spacers, wherein remained portions of the third and fourth fins constitute bottoms of the third and fourth recesses.

10. The method according to claim 9, further comprising:
    concurrently forming another epitaxial structure from the remained portions of the third and fourth fins during forming the first epitaxial structure and the second epitaxial structure.

11. The method according to claim 1, wherein each of the first and second epitaxial structures is asymmetric in structure.

12. A method, comprising:
    forming a first fin and a second fin over a substrate, wherein the first fin is discrete from the second fin;
    forming a gate structure crossing over the first and second fins;
    forming a first spacer layer overlaying the gate structure, and the first and second fins, wherein the first spacer layer has a vertical portion completely filling a space between the first and second fins;

implanting a material into a portion of the first spacer layer to convert the portion into an etching resistant layer, wherein the vertical portion is free from being converted into the etching resistant layer;

forming a second spacer layer overlaying the etching resistant layer;

etching the second spacer layer, the etching resistant layer, the vertical portion, and the first and second fins to form a first spacer, a second spacer, a third spacer, a first recess between the first and second spacers, and a second recess between the first and third spacers, wherein the first spacer has a top surface lower than top surfaces of the second and third spacers, wherein remained portions of the first and second fins constitute bottoms of the first and second recesses; and forming a epitaxial structure from the remained portions of the first and second fins.

13. The method according to claim 12, wherein the etching resistant layer has an etching resistance greater than an etching resistance of the first spacer layer.

14. The method according to claim 12, wherein implanting the material into the portion of the first spacer layer comprises implanting the material in a direction along a lengthwise axis direction of the gate structure with a depression angle of 70 degrees to 85 degrees.

15. The method according to claim 12, wherein etching the second spacer layer, the etching resistant layer, the vertical portion, and the first and second fins comprises applying an etchant having a higher etching selectivity for the first and second fins with respect to the second spacer layer and the etching resistant layer.

16. The method according to claim 12, wherein the etching resistant layer comprises SiON, SiCON or a combination thereof.

17. The method according to claim 12, wherein the material comprises carbon, oxygen, or a combination thereof.

18. A method, comprising:

receiving or providing a substrate having a cell region and a logic region thereon;

forming a first fin and a second fin on the cell region and a third fin and a fourth fin on the logic region;

forming a first gate structure crossing over the first and second fins and forming a second gate structure crossing over the third and fourth fins;

forming a first spacer layer overlaying the gate structure, and the first, second, third, and fourth fins, wherein the first spacer layer partially fills a space between the first and second fins but completely fills a space between the third and fourth fins;

implanting a material into a portion of the first spacer layer to convert the portion of the first spacer layer into an etching resistant layer having a first portion and a second portion respectively wrapping the first and second fins, wherein a spacing exists between the first and second portions, wherein the space between the third and fourth fins is free of the etching resistant layer;

forming a second spacer layer overlaying the etching resistant layer and filling the spacing between the first and second portions;

etching the second spacer layer, the etching resistant layer and the first and second fins to form a first spacer, a second spacer, a third spacer, a first recess between the first and second spacers, and a second recess between the first and third spacers, wherein the first spacer has a top surface over than top surfaces of the second and third spacers, wherein remained portions of the first and second fins constitute bottoms of the first and second recesses; and forming a first epitaxial structure and a second epitaxial structure respectively from the remained portions of the first and second fins.

19. The method according to claim 18, wherein the first fin is spaced apart from the second fin by a first distance, the third fin is spaced apart from the fourth fin by a second distance, and the first distance is less than the second distance.

20. The method according to claim 18, etching the second spacer layer, the etching resistant layer and the first and second fins comprises concurrently etching another portion of the first spacer layer and the third and fourth fins to form a fourth spacer, a fifth spacer, a sixth spacer, a third recess between the fourth and fifth spacers, and a fourth recess between the fourth and sixth spacers, wherein the fourth spacer has a top surface lower than top surfaces of the fifth and sixth spacers, wherein remained portions of the third and fourth fins constitute bottoms of the third and fourth recesses.

* * * * *